(12) United States Patent
Spruit et al.

(10) Patent No.: US 9,207,547 B2
(45) Date of Patent: Dec. 8, 2015

(54) LITHOGRAPHIC APPARATUS AND DEVICE MANUFACTURING METHOD

(75) Inventors: Johannes Hendrikus Maria Spruit, Waalre (NL); Ruud Antonius Catharina Maria Beerens, Roggel (NL)

(73) Assignee: ASML NETHERLANDS B.V., Veldhoven (NL)

(*) Notice: Subject to any disclaimer, the term of this patent is extended or adjusted under 35 U.S.C. 154(b) by 560 days.

(21) Appl. No.: 13/610,466

(22) Filed: Sep. 11, 2012

(65) Prior Publication Data

US 2013/0077072 A1    Mar. 28, 2013

Related U.S. Application Data

(60) Provisional application No. 61/539,826, filed on Sep. 27, 2011.

(51) Int. Cl.
*G03B 27/42* (2006.01)
*G03F 7/20* (2006.01)

(52) U.S. Cl.
CPC .......... *G03F 7/7085* (2013.01); *G03F 7/70575* (2013.01)

(58) Field of Classification Search
CPC ................. G01B 11/16; G01B 11/272; G01B 2210/306; G01B 9/02091; G01B 11/14; G01B 11/2441; G01B 9/02027; G01B 9/02; G01B 9/02069; G01B 9/02041; G01B 2290/45; G01B 2290/25; G01B 9/02015; G01B 11/02; G01B 2210/50; G01B 2290/30; G01M 17/04; G03F 7/7085; G03F 7/70375; G03F 7/70391; G03F 7/704; G03F 7/70575; G01N 23/207

USPC ............................................................ 355/53
See application file for complete search history.

(56) References Cited

U.S. PATENT DOCUMENTS

| | | | |
|---|---|---|---|
| 2006/0175910 A1* | 8/2006 | Asano et al. | 310/12 |
| 2007/0107529 A1* | 5/2007 | Maurin | 73/800 |
| 2010/0231889 A1* | 9/2010 | Den Boef | 355/72 |

FOREIGN PATENT DOCUMENTS

| | | |
|---|---|---|
| JP | H09-007943 | 1/1997 |
| JP | H11-008189 | 1/1999 |
| JP | 2001-267234 | 9/2001 |
| JP | 2003-211506 | 7/2003 |
| JP | 2004-281654 | 10/2004 |
| JP | 2007-183105 | 7/2007 |
| JP | 2008-173397 | 7/2008 |
| JP | 2010-109330 | 5/2010 |
| WO | 2007/049603 | 5/2007 |

* cited by examiner

*Primary Examiner* — Mesfin T Asfaw
(74) *Attorney, Agent, or Firm* — Pillsbury Winthrop Shaw Pittman LLP

(57) ABSTRACT

A lithographic apparatus includes a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a measurement system with a measurement radiation system to provide a measurement beam of radiation, at least two reflectors to reflect a portion of the measurement beam between the reflectors; and a detector to detect a wavelength of at least a portion of the measurement beam transmitted through one of the reflectors.

20 Claims, 4 Drawing Sheets

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/539,826, entitled "Lithographic Apparatus and Device Manufacturing Method," filed on Sep. 27, 2011, the content of which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The size of the circuit pattern may be decreasing and therefore the resolution capabilities of the lithography apparatus may be increasing. The precision requirement within the apparatus may therefore also be increasing. Therefore there may be a need for an improved measurement system.

SUMMARY

It is desirable to provide an improved measurement system in the lithographic apparatus.

According to an embodiment of the invention, there is provided a lithographic apparatus comprising: a substrate table constructed to hold a substrate; a projection system configured to project the patterned radiation beam onto a target portion of the substrate, a measurement system comprising; a measurement radiation system for providing a measurement beam of radiation at least two reflectors to reflect a significant portion of the measurement beam between the reflectors; and, a detector to detect a wavelength of at least a portion of the measurement beam transmitted through one of the reflectors.

According to an embodiment of the invention, there is provided a device manufacturing method comprising transferring a pattern from a patterning device onto a substrate, wherein the method comprises measuring a distance between two reflectors by radiating a measurement beam of radiation towards the reflectors; reflecting a significant portion of the measurement beam between the reflectors; and, detecting a wavelength of a beam transmitted through one of the reflectors.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
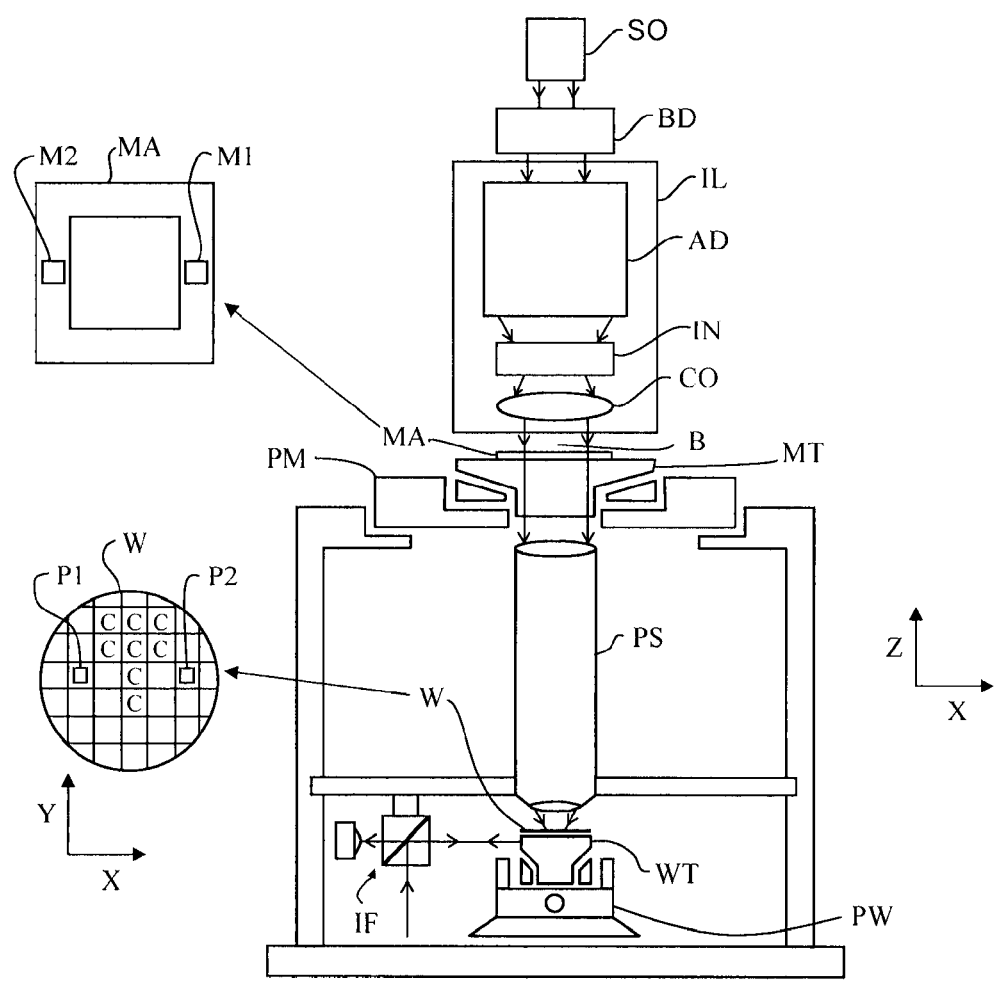
FIG. 1 depicts a lithographic apparatus according to an embodiment.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
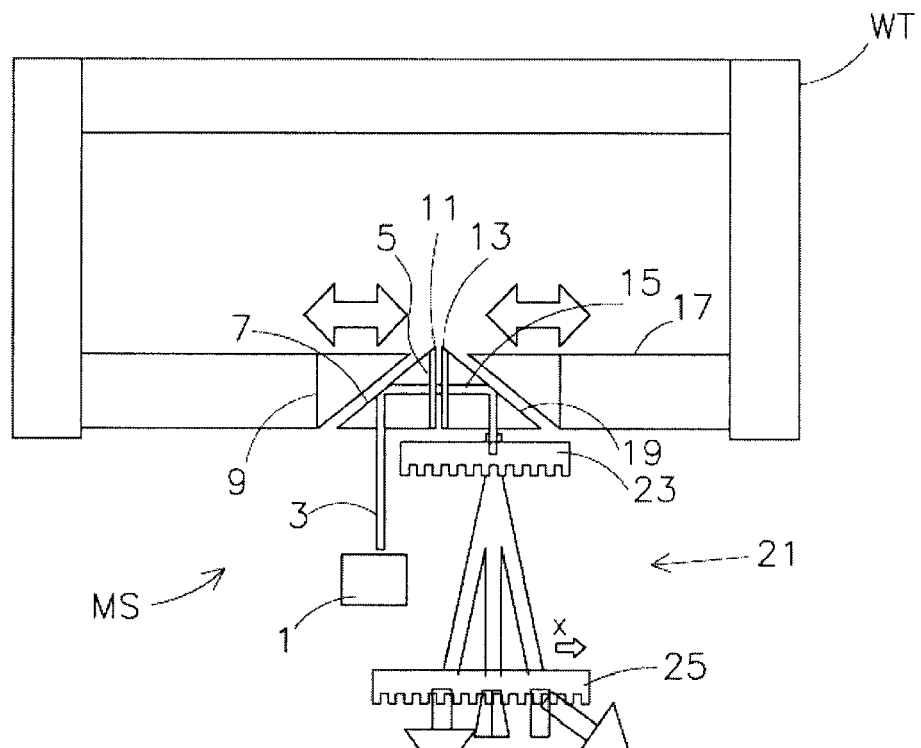
FIG. 2 depicts a measurement system for use in the substrate table WT of FIG. 1 according to an embodiment.

FIG. 2 depicts a measurement system MS for use in the substrate table WT of FIG. 1 constructed and arranged to measure a deformation within the substrate table WT. The measurement system MS comprises a radiation system 1 configured to provide a measurement beam of radiation 3. The radiation may have a width in the wavelength spectrum of 0.1 to 200 nm, in an embodiment 1 to 50 nm and in another embodiment 2 to 20 nm. For example, the wavelength spectrum may be from 400-450 nm. The measurement radiation system may be a high frequency modulated light emitting diode or a super luminescent light emitting diode which may be capable of providing a measurement beam of radiation with a width in the wavelength spectrum. Alternatively a laser may be used which is scanned over a wavelength range for the measurement beam of radiation. The measurement beam of radiation 3 may be provided to a measurement branch comprising a first and second prism shaped bodies 5, 17. The measurement beam of radiation may be reflected within the first prism shaped body 5 by the first prism reflector 7. A first prism reflector 7 reflects the measurement beam of radiation towards at least two reflectors 11, 13. The two reflectors 11, 13 may be coated on the first and second prism shaped bodies 5, 17 to reflect, in an embodiment, a significant portion (e.g. preferably 95 to 99%) of the measurement beam between the reflectors 11, 13. The reflectors 11, 13 may be positioned at a distance 1 of less than 1 mm e.g. at 0.05 to 1 mm or in an embodiment at 0.1 to 0.2 mm from each other. Alternatively, the distance 1 may be larger than 1 mm e.g. from 1 to 200 mm.

Figure 3:
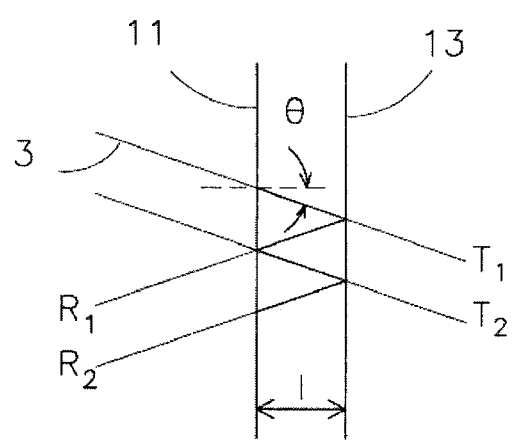
FIG. 3 depicts reflections between the reflectors of FIG. 2.

FIG. 3 depicts what happens between the reflectors e.g. mirrors 11, 13 when a measurement beam is entering between an etalon formed by the two mirrors 11, 13. The broadband measurement beam may be reflected (R1, R2) between the mirrors 11, 13 and for the wavelengths in the beam that have the same phase at the mirror 13 constructive interference occurs between T1 (which was not reflected) and T2 (which was reflected two times) and these wavelengths are transmitted through the mirror 11 The wavelengths that are interfering at the mirror 13 and are consequently transmitted are a function of the distance between the mirrors 11 and 13, the angle θ and the refractive index of the medium between the mirrors. By keeping the angle θ constant the transmitted wavelengths are a function of the distance 1 between the mirrors 11, 13. By measuring the wavelength of the transmitted beam T the distance between the mirrors can be determined. Using high reflectivity mirrors and incorporating beams that are reflected more than two times T3, T4, T5, . . . the selectivity and the resolution may increase by transmitting light T with a smaller wavelength bandwidth. The transmitted beam T, 15 (in FIG. 2) may be reflected within the second prism shaped body 17 by the second prism reflector 19. The second prism reflector 19 may reflect the measurement beam of radiation towards a detector 21 configured to detect a wavelength of the measurement beam transmitted through one of the mirrors 11, 13.

The detector 21 may be used for determining the wavelengths interfering between the mirrors 11, 13. The detector may be provided with a first periodical structure e.g. first grating 23 to diffract the transmitted beam 15 in a +1, 0 and −1 order. The angle λ is a function of the wavelength of the transmitted beam 15 and by measuring this angle λ the wavelengths in the transmitted beam can be determined. For this measurement a second periodical structure e.g. second grating 25 may be used.

Figure 4:
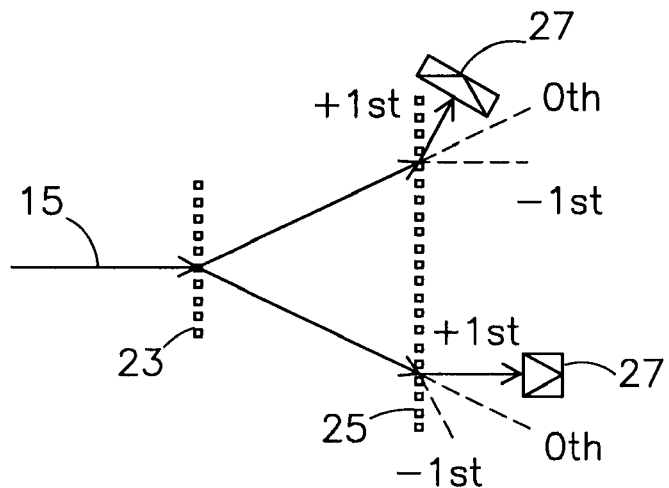
FIG. 4 depicts in top view schematically and partially a detector according to an embodiment.
Figure 5:
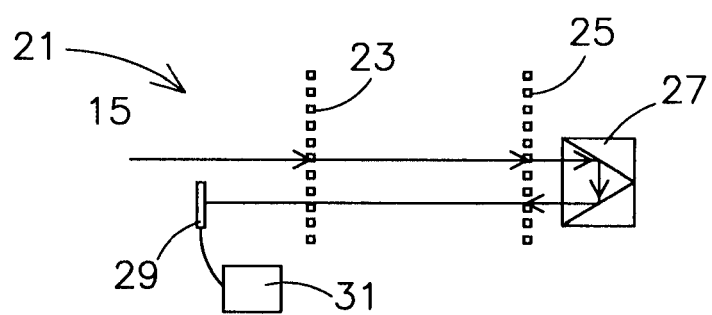
FIG. 5 depicts in side view the detector of FIG. 4.

FIGS. 4 and 5 depict schematically and partially a detector 21 according to an embodiment with enhanced resolution in top view and side view, respectively. In this embodiment use is made of interferometry between +1st and +1st refracted orders of a transmitted beam 15.

A first periodical structure e.g. first grating 23 to diffract the transmitted beam 15 in a +1, 0, and −1 order. The angle λ is a function of the wavelength of the transmitted beam 15 and by measuring this angle λ the wavelengths in the transmitted beam can be determined. The diffracted beams are again diffracted by gratings 25 to obtain the +1st and −1st refracted orders. The +1st and −1st refracted orders are each guided via retro-reflectors 27 to detector element 29, for instance a photo diode. By measuring the change in intensity of the light received by each of the detection elements 29, the chance of wavelength of the transmitted beam 15 may be determined. When the wavelength changes the beam crosses the second grating structure and a sinusoidal signal is obtained at the detector.

Since the state of the art interpolation factor of photo diodes to detect the sine wave may be in the order of 5000×, which is substantially larger than the 100× achievable interpolation for a CCD array, resolution can be further enhanced, even down to the order of 10 pε for a measurement range of about 10 με (ε is a measure of the amount of strain). Any suitable combination of orders may be used, for example also the first or second order of a single branch, e.g. the +2, +1st, $0^{th}$, 1st and the 2th order of the first branch. A controller 31 may be used to calculate a distance 1 between the mirrors 11, 13 from the transmitted beam 15. The distance may be measured with an accuracy of less than a few nm e.g. on picometer level. It is therefore suitable for measuring a deformation in a stiff substrate table WT.

The measurement system MS may be used to control deformations within the substrate table WT for example the system may be used to counteract deformations during accelerations or decelerations, but also to counteract deformations due to other causes, such as temperature differences between different parts of the substrate table or external forces exerted on the substrate table, for instance forces exerted by an immersion system of the lithographic apparatus. The detector may be capable of measuring over a broad wavelength spectrum width for example of 0.1 to 200 nm, in an embodiment 1 to 50 nm and in another embodiment 2 to 5 nm. For example, the detector may be measuring from 400-450 nm.

Alternatively if a scanned laser system is used for the measurement radiation system and if the wavelength of the radiation transmitted by the measurement radiation system is known the detector may just measure the intensity of the transmitted beam. If the detector measures transmission of the measurement beam through the etalon, the distance between the reflectors may be calculated with the wavelength of the radiation that is transmitted. A benefit of the embodiment according to FIG. 2 may be that the only passive components are provided to the substrate table and that active components (measurement radiation system, sensors) may be provided at a separate frame. There may be no physical connection necessary between the passive components and the active components of the measurement system so that there is no mechanical short cut to the substrate table. Vibration or thermal fluctuations in the active components may not influence the substrate table.

Figure 6:
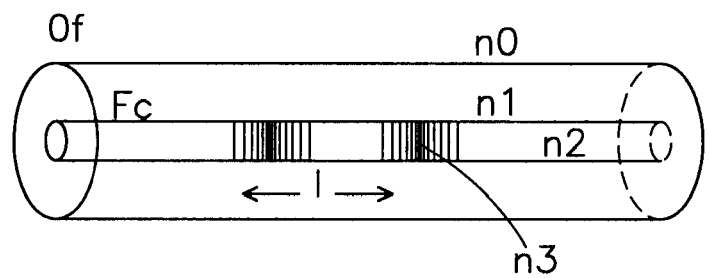
FIG. 6 depicts a measurement branch for use in the substrate table WT of FIG. 1 according to an embodiment.

FIG. 6 depicts a measurement branch for the measurement system for use in the substrate table WT of FIG. 1 according to another embodiment. The measurement branch may replace the first and second prism shaped body 5, 17, the first and second prism reflector 7, 19 and the mirrors 11, 13 in FIG. 2. The measurement branch is provided with an optical fiber OF and a measurement beam of radiation is provided to the fiber core Fc of the optical fibre OF. Within the fiber core there are portions with a relatively high refractive index n3 and a relatively low refactive index n2 which function as a fiber Bragg grating in response to the measurement beam of radiation. The detector of FIGS. 4 and 5 may be used to measure a distance 1 within the Bragg grating with a high accuracy in response to the measurement beam of radiation which is reflected back by the Bragg grating. A benefit of using a fiber core with refractive index modulation i.e. a fiber Bragg grating is that the alignment of the reflectors is relatively easy because this is build in by the fiber. Another benefit is that the fiber is rather compact and it may be easy to build it in a substrate table or other component of the lithographic apparatus. Such other component may be, for example, the support structure MT, a reference frame configured to support at least part of position sensor IF, a reference frame configured to support at least part of the projection system, the projection system or any combination thereof. To increase the accuracy of the fiber the portions with relatively high and relatively low refractive index may repeated multiple times as depicted in FIGS. 7 and 8.

Figure 7:
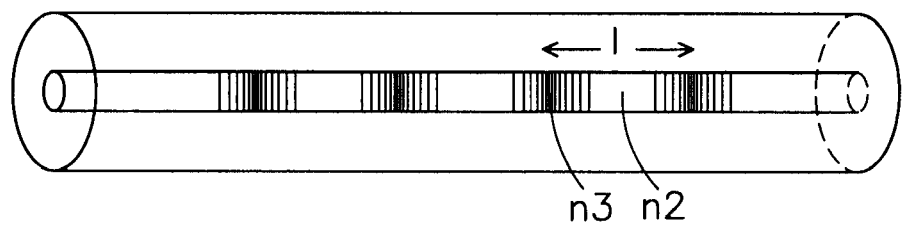
FIG. 7 depicts a measurement branch for use in the substrate table WT of FIG. 1 according to an embodiment; and, FIG. 8 depicts a measurement branch for use in the substrate table WT of FIG. 1 according to an embodiment.

FIG. 7 depicts a measurement branch for the measurement system for use in the substrate table WT of FIG. 1 according to an embodiment wherein the distance 1 between the portions with a relatively high refractive index n3 and a relatively low refractive index n2 are repeated multiple times in the Bragg grating so as to increase the reflectivity of the measurement system and also to increase the precision.

Figure 8:
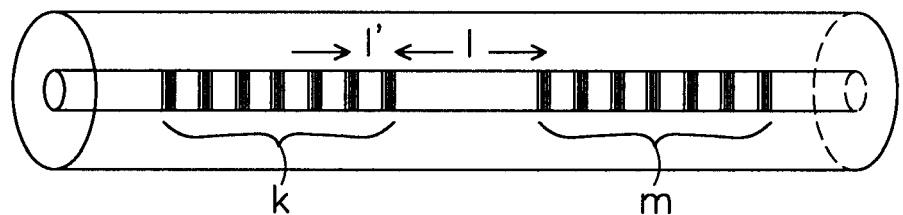

FIG. 8 depicts a measurement branch for a measurement system for use in the substrate table WT of FIG. 1 according to an embodiment. The first reflective area k and the second reflective area m are provided with portions with a relatively high refractive index n3 and a relatively low refractive index n2 at a distance 1' of each other so that both reflective areas function as reflectors at a distance 1 of each other. By providing a measurement beam of radiation to the fiber the wavelength of the transmitted or reflected beam may give us information about the distance I or a change in the distance 1. The border between the first and second reflective area may be discrete or more gradually. The distance 1 as shown is in figure may be larger than 1' however 1 may also be equal or smaller than 1'. A major benefit of the fourth embodiment over conventional Fiber Bragg Gratings is that the transmitted peak is much smaller. The width of the transmitted peak in this configuration can be over a factor 100 smaller as compared to the width in the reflected peak in a regular FBG. This small peak makes detection of the wavelength variations much easier. Another benefit is that the length 1 can be increased relatively easy, making an averaging of a strain over longer length in a chuck possible.

In a further embodiment, the detector may have an enhanced resolution for the wavelength determination, for example by at least a factor 100, preferably 1000, or even more by using diffraction from dispersing elements in a first direction and a second direction, each of these in planes that are substantially perpendicular to each other. For more information of such detector reference is made to FIGS. 4 and 5 and related description of U.S. patent application 61/469,414 as incorporated herein by reference.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a substrate table constructed to hold a substrate;
a projection system configured to project a patterned radiation beam onto a target portion of the substrate, and
a measurement system comprising
a measurement radiation system configured to provide a measurement beam of radiation;
at least two reflectors configured to reflect a portion of the measurement beam of radiation between the reflectors;
a detector configured to detect a wavelength of at least a portion of the measurement beam of radiation transmitted through one of the reflectors, and
a controller in communication with the detector and configured to determine a distance between the two reflectors from said portion of the measurement beam of radiation transmitted through said one of the reflectors.

2. The lithographic apparatus according to claim 1, wherein the at least two reflectors of the measurement system are provided in a component of the lithographic apparatus, so as to measure a deformation of the component.

3. The lithographic apparatus according to claim 2, wherein the component is at least one of the substrate table, a support structure configured to hold a patterning device configured to pattern a beam of radiation to form the patterned beam of radiation, a reference frame and the projection system.

4. The lithographic apparatus according to claim 1, wherein the portion is 95 to 99% of the radiation of the measurement beam.

5. The lithographic apparatus according to claim 1, wherein the reflectors comprise a mirror.

6. The lithographic apparatus according to claim 1, wherein the reflectors comprise a coated side of a transmissive body.

7. The lithographic apparatus according to claim 1, wherein the reflectors comprises a fiber core with refractive index modulation.

8. The lithographic apparatus according to claim 7, wherein the fiber core with refractive index modulation comprise a fiber core with a first portion of the core having a first refractive index and a second portion of the core having a second refractive index and in a first area of the core a distance between the first portions having a first constant value.

9. The lithographic apparatus according to claim 7, wherein the fiber core with refractive index modulation comprise a fiber core with first portions of the core having a first refractive index and second portions of the core having a second refractive index and within a first and a second reflective area the distance between the first portions have a second constant value and a distance between the first and second reflective area being equal to a third value.

10. The lithographic apparatus according to claim 1, wherein the detector is constructed and arranged to perform a measurement over a broad wavelength spectrum.

11. The lithographic apparatus according to claim 1, wherein the radiation system provides a measurement beam of radiation with a broad wavelength spectrum.

12. The lithographic apparatus according to claim 11, wherein the broad wavelength spectrum is 0.1 to 200 nm.

13. The lithographic apparatus according to claim 12, wherein the broad wavelength spectrum is 1 to 50 nm.

14. The lithographic apparatus according to claim 13, wherein the broad wavelength spectrum is 2 to 20 nm.

15. The lithographic apparatus according to claim 1, wherein the radiation system comprises one of a high frequency modulated light emitting diode, a super luminescent light emitting diode, and a laser with a variable wavelength.

16. The lithographic apparatus according to claim 1, wherein the two reflector are provided at a distance of less than 1 mm from each other.

17. The lithographic apparatus according to claim 16, wherein the two reflector are provided at a distance from 0.05 to 1 mm from each other.

18. The lithographic apparatus according to claim 17, wherein the two reflector are provided at a distance from 0.1 to 0.2 mm from each other.

19. The lithographic apparatus according to claim 1, wherein the portion of the measurement beam of radiation detected by the detector is transmitted through the two reflectors.

20. The lithographic apparatus according to claim 1, wherein the detector is configured to detect interferences between wavelengths in said portion of the measurement beam of radiation transmitted through said one of the reflectors.

* * * * *